(12) United States Patent
Heryanto et al.

(10) Patent No.: US 10,475,803 B2
(45) Date of Patent: Nov. 12, 2019

(54) METHOD FOR MAKING NON-VOLATILE MEMORY DEVICE

(71) Applicant: GLOBALFOUNDRIES Singapore Pte. Ltd., Singapore (SG)

(72) Inventors: Anson Heryanto, Singapore (SG); Eng Huat Toh, Singapore (SG); Yongshun Sun, Singapore (SG); Yoke Leng Lim, Singapore (SG); Siow Lee Chwa, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 53 days.

(21) Appl. No.: 15/947,488

(22) Filed: Apr. 6, 2018

(65) Prior Publication Data
US 2019/0312046 A1    Oct. 10, 2019

(51) Int. Cl.
*H01L 21/336* (2006.01)
*H01L 27/11524* (2017.01)
*H01L 21/8239* (2006.01)
*H01L 27/11558* (2017.01)

(52) U.S. Cl.
CPC .... *H01L 27/11524* (2013.01); *H01L 21/8239* (2013.01); *H01L 27/11558* (2013.01)

(58) Field of Classification Search
CPC ........... H01L 21/0214; H01L 21/02164; H01L 21/0217; H01L 21/02532; H01L 21/02595; H01L 21/32053; H01L 27/11521; H01L 27/11568; H01L 29/66825; H01L 21/28273; H01L 29/7881; H01L 27/11524; H01L 27/11556; H01L 27/11582; H01L 29/42324; H01L 29/42328; H01L 27/1157; H01L 29/66833; H01L 29/788; H01L 21/28282; H01L 29/7889; H01L 29/792; H01L 27/11517; H01L 27/11519; H01L 29/7926; H01L 29/7883; H01L 27/11531; H01L 27/11551; H01L 27/11558; H01L 29/66666; H01L 27/11565; H01L 2924/0002; H01L 29/42332; H01L 29/42344; H01L 27/115; H01L 27/11526; H01L 27/11529; H01L 27/11573; H01L 29/66545; H01L 21/76224
See application file for complete search history.

(56) References Cited

U.S. PATENT DOCUMENTS 9,111,866 B2    8/2015    Chen et al.

OTHER PUBLICATIONS

Entire prosecution history U.S. Appl. No. 15/286,592, filed Oct. 6, 2016.

*Primary Examiner* — Robert G Bachner
(74) *Attorney, Agent, or Firm* — Ditthavong & Steiner P.C.

(57) ABSTRACT

Method for forming a memory device are disclosed. Embodiments include forming memory cells over a substrate, each memory cell includes a control gate (CG) formed over a floating gate (FG) and a select gate (SG) formed adjacent to a first side of the CG and FG, wherein a vertical oxide layer is formed between the SG and the CG and FG, forming an implant mask layer over a portion of the SG, CG and vertical oxide of each memory cell; and implanting dopants into the substrate using the implant mask to form source drain (S/D) regions between the memory cells.

20 Claims, 3 Drawing Sheets

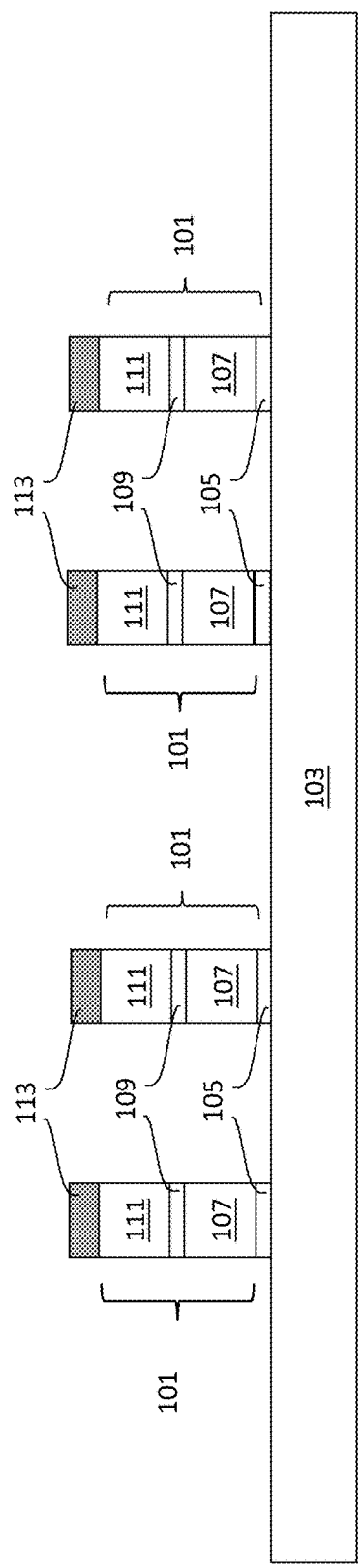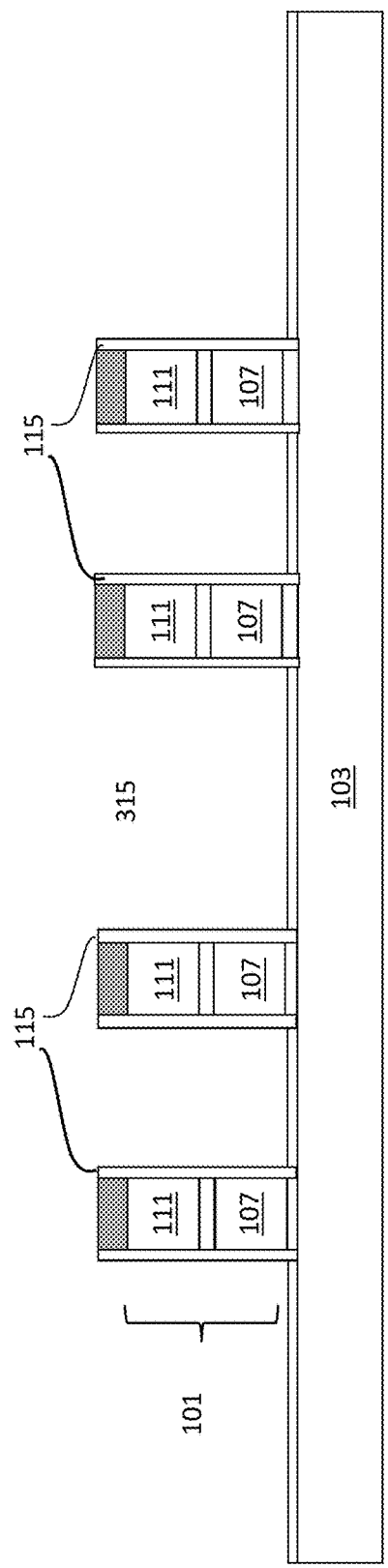

METHOD FOR MAKING NON-VOLATILE MEMORY DEVICE

TECHNICAL FIELD

The present disclosure generally relates to semiconductor devices. The present disclosure is particularly applicable to non-volatile memory (NVM) devices.

BACKGROUND

Non-volatile memory (NVM) devices are able to retain stored data even when the power supply is interrupted. Non-volatile memory devices include flash devices which can be programmed using electrical signals. The memory transistor can be of various types. For example, the memory transistor may have a stacked gate structure having a control gate over a floating gate and a select gate adjacent the control and floating gates.

During fabrication of the memory devices, unwanted dopants from implants are trapped in the oxide separating the control gate and select gate. This causes damage to the oxide and bridging can occur between the select gate and control gate due to unwanted dopant which can lead to shorting. These issues cause defects or failures, impacting device yields.

The present disclosure is directed to a method of forming a memory cell with improved performance and reliability.

SUMMARY

An aspect of the present disclosure is to improve inter-poly oxide oxide (IPO) in a memory cell without requiring an additional mask layer. Another aspect of the present disclosure is to provide a implant mask to protect a NVM cell during implantation of lightly doped drain (LDD) and n-type dopants in a source/drain (S/D) region. Yet another aspect is to provide an implant mask with improved resist lift-off stability.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming memory cells over a substrate, each memory cell includes a control gate (CG) formed over a floating gate (FG) and a select gate (SG) formed adjacent to a first side of the CG and FG, wherein a vertical oxide layer is formed between the SG and the CG and FG, forming an implant mask layer over a portion of the SG, CG and vertical oxide of each memory cell; and implanting dopants into the substrate using the implant mask to form S/D regions between the memory cells.

Aspects of the present disclosure include forming a dielectric layer between the CG and FG; and forming an etching mask over the control gate prior to forming the implant mask. Other aspects include the vertical oxide being an inter-poly oxide. Another aspect includes implanting LDD and n-type dopants in the S/D regions. Further aspects include the memory cells including split-gate NVM cells. Another aspect includes forming an interpoly dielectric (IPD) between the CG and FG. Yet another aspect includes forming an oxide between the FG and the substrate. Other aspects include forming an oxide between the SG and the substrate.

Another aspect of the present disclosure is a method including forming memory cells over a substrate, each memory cell including a CG formed over a FG and a SG formed adjacent to a first side of the CG and FG, wherein a vertical IPO layer is formed between the SG and the CG and FG, forming a dielectric layer between the CG and FG; forming an etching mask over the control gate; forming and patterning an implant mask layer over a portion of the SG, CG and vertical oxide of each memory cell; implanting dopants into the substrate using the implant mask to form S/D regions between the memory cells.

Aspects of the present disclosure include implanting LDD and n-type dopants in the S/D regions. Aspects of the present disclosure include the memory cells including split-gate NVM cells. Other aspects include forming an IPD between the CG and FG. Another aspect includes forming an oxide between the FG and the substrate. Further aspects include forming an oxide between the SG and the substrate.

A further aspect of the present disclosure is a method including: forming a first polysilicon gate layer over a substrate; etching the first polysilicon gate layer to form a FG over the substrate; consecutively forming a dielectric layer, an second polysilicon gate layer and hard mask (HM) and patterning to form a CG over the FG with the dielectric formed between the FG and CG and the HM formed over the CG; forming an IPO on sides of the FG and CG; forming a third polysilicon gate layer and etching to form a SG on a first side of the FG and CG; forming an implant mask over a portion of the SG, CG and IPO; and implanting dopants into the substrate using the implant mask to form a S/D region.

Aspects of the present disclosure include implanting LDD and n-type dopants in the S/D region. Aspects of the present disclosure include the memory cells being split-gate non-volatile NVM cells. Other aspects include forming a tunnel oxide layer over the substrate prior to forming the first polysilicon gate layer. Another aspect includes the dielectric layer including an IPD. Further aspects include forming sidewall spacers over the S/D region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A-1D illustrate a process flow for fabricating a split-gate memory cell, in accordance with an exemplary embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of IPO stability due to presence of unwanted dopant during implantation. Post formation of NVM structure, the cell is exposed during LDD and n-type implant, which degrades oxide quality and causes NVM reliability failure. The problem is solved, inter alia, by forming memory cells over a substrate, each memory cell includes a CG formed over a FG and a SG formed adjacent to a first side of the CG and FG, wherein a vertical oxide layer is formed between the SG and the CG and FG, forming an implant mask layer over a portion of the SG, CG and vertical oxide of each memory cell; and implanting dopants into the substrate using the implant mask to form S/D regions between the memory cells.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1C:
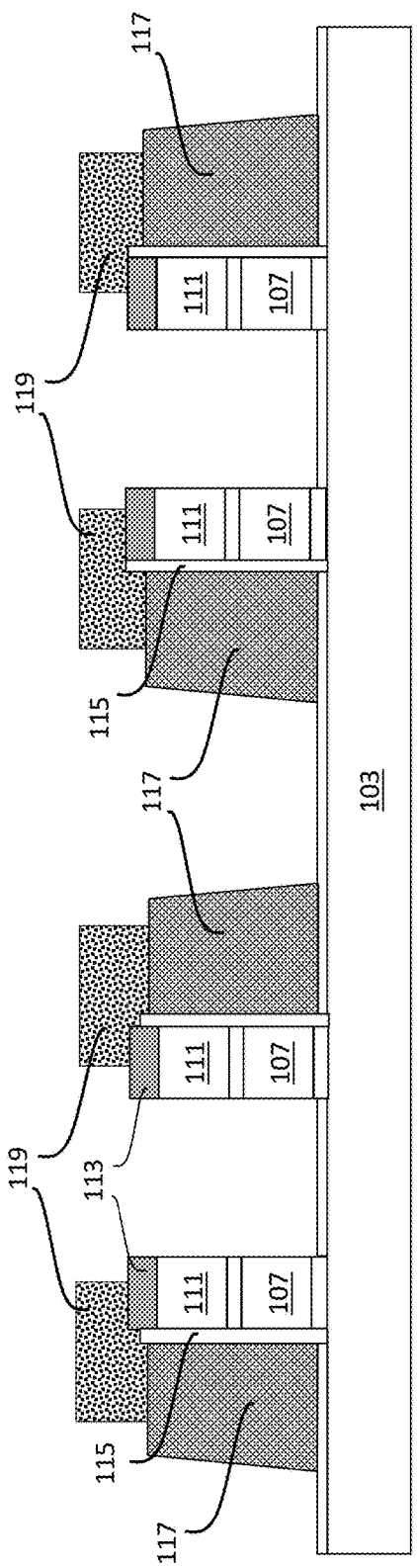

FIGS. 1A through 1D schematically illustrate, in cross sectional view, various process steps for fabricating a split-gate NVM cell, in accordance with an exemplary embodiment of the present disclosure. FIG. 1A illustrates dual polysilicon gate-stack structures 101 formed on an upper surface of substrate 103, after front end of line (FEOL) integrated circuit (IC) fabrication processes. Dual polysilicon gate-stacks 101 are formed by depositing a first polysilicon layer on a tunnel oxide layer 105 and etching to form FG 107 over tunnel oxide 105. Next, an IPD layer, a CG polysilicon layer, and a thick nitride layer are consecutively deposited and patterned to form IPD 109, CG 111, and hard-mask 113, respectively. The tunnel oxide 105 material may be silicon dioxide, any high-k dielectric, for example hafnium oxide ($HfO_2$), in-situ steam generation (ISSG), or any other tunnel dielectric. The IPD 109 may be oxide/nitride/oxide (ONO). Hard-mask 113 may be a nitride.

Adverting to FIG. 1B, an IPO layer 115 is formed on the sidewalls of the dual polysilicon gate-stacks 101. To form IPO layer 115, a thin oxide layer is deposited on the dual polysilicon gate-stacks 101 by a conformal deposition process and then anisotropically etched with hard-mask 113 serving as an etch stop. IPO layer 115 improves CG-SG isolation between dual polysilicon gate-stack 101 and the adjacent SG that is formed in a later step.

Adverting to FIG. 1C, a third polysilicon layer 117 is deposited and etched. The deposited third polysilicon layer 117 initially covers the dual polysilicon gate stacks 101 (not shown for illustrative convenience) and, following the etching, the height of third polysilicon layer 117 is equal to or less than the height of dual polysilicon gate-stacks 101. A conventional spacer anisotropic etch self-aligned to hard-mask 113 may be used, thus protecting CG 111 during the etching. Following the etching, the SG 117 are formed adjacent to the CG 111 and FG 107. The IPO layer 115 improves CG-SG isolation between dual polysilicon gate-stack 101 and the SG 117.

Figure 1D:
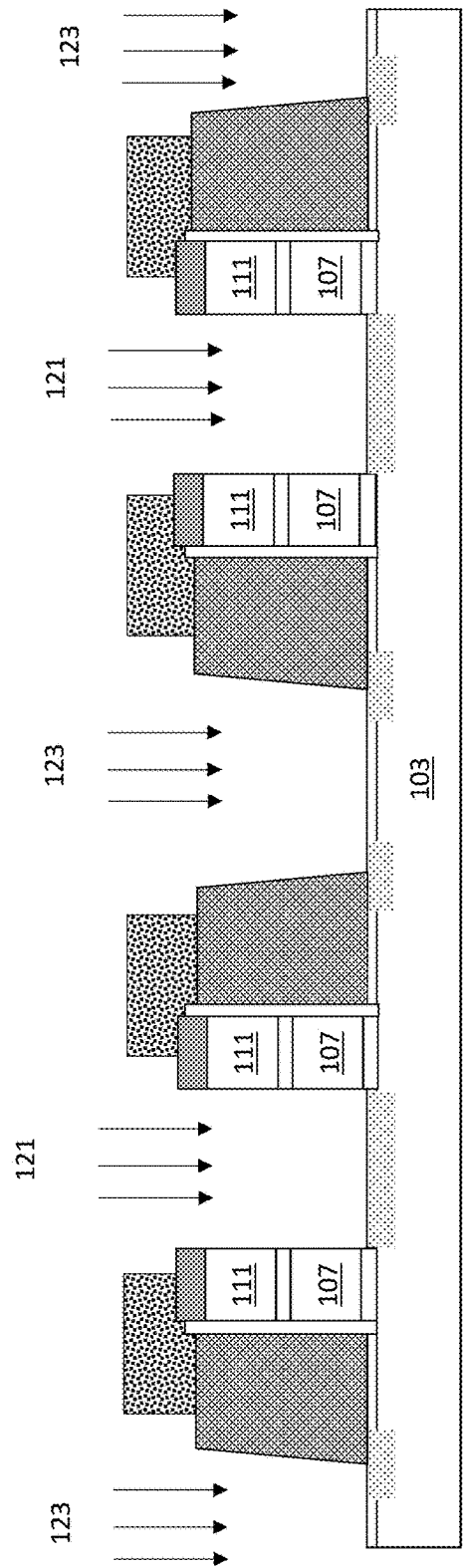

In FIG. 1C, an implant mask/resist 119 is formed and patterned to cover the IPO layer 115 as well as a portion of the SG 117 and the HM 113. The implant mask 119 can be formed of a photoresist material selected and having a thickness of 150 to 170 nm and width of 120 to 140 nm. The implant mask/resist 119 blocks penetration of dopants into the IPO layer 115 during implantation of LDD and n-type dopants into S/D regions. A deep ultraviolet (UV) lithography process is used to form the mask/resist 119. The mask/resist 119 is dispensed onto the wafer, prebaked then exposed to the light. Next, the mask/resist that is exposed to the UV light is removed by a developer. No etching process is required to remove the mask/resist 119. Energy-dispersive X-ray spectroscopy (EDS) mapping can confirm whether an implant material is present in the IPO layer 115. Implantation of the n-type dopant 121 into the source regions and LDD dopant 123 into the drain regions is illustrated in FIG. 1D. The LDD dopant 123 can be selected from Arsenic (As) and implanted at a dopant concentration of 1E+14 to 1E+15 $cm^{-3}$. The n-type dopant 121 can be selected from As and implanted at a dopant concentration of 1E+15 and 1E+16 $cm^{-3}$.

Sidewall spacers (not shown) are formed on exposed vertical surfaces. Sidewall spacers provide alignment for a salicide process to form salicide contact regions (not shown) on the exposed upper surfaces of CG 111 and SG 117.

Figure 2:
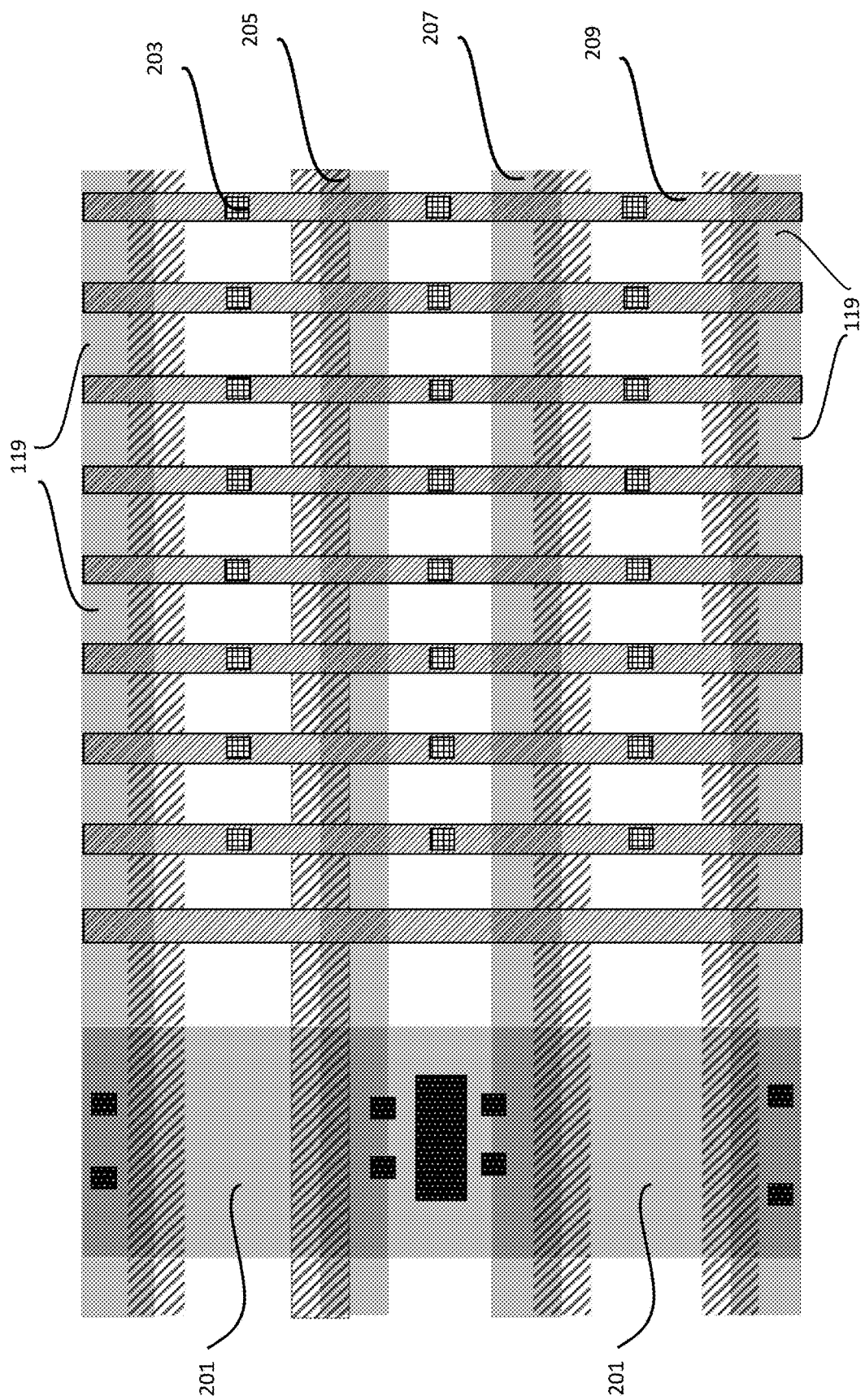
FIG. 2 schematically illustrates, in top view, a memory cell layout with implant mask, in accordance with an exemplary embodiment.

Adverting to FIG. 2, a top view of a memory cell layout is illustrated. Implant mask/resist 119 is present on top of a NVM cell, such as is illustrated in cross-sectional view in FIG. 1C. Moreover, strap 201 for the resist/mask 119 improves mask/resist 119 lifting. Resist strap 201 is a mask design to cover NVM cell. The memory cell layout includes contact (CA) 203, control gate (CG) 205, resist 207 and substrate 209.

The embodiments of the present disclosure can achieve several technical effects including enabling improved split-gate flash reliability by proving a mask on top of a NVM cell to block dopant penetration to the IPO. Embodiments of the present disclosure can also enjoy utility in various industrial applications as, for example, in microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of NVM memory devices, including 40 nanometer technology nodes and beyond for split gate technology or other semiconductor technologies that experience oxide reliability issues.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure can use various other combinations and embodiments and is capable of any changes or modifications within the scope of the inventive concept as expressed herein.

The invention claimed is:

1. A method comprising:
    forming memory cells over a substrate, each memory cell includes a control gate (CG) formed over a floating gate (FG) and a select gate (SG) formed adjacent to a first side of the CG and FG, wherein a vertical oxide layer is formed between the SG and the CG and FG,
    forming an implant mask layer over a portion of the SG, CG and vertical oxide of each memory cell; and
    implanting dopants into the substrate using the implant mask to form source drain (S/D) regions between the memory cells.

2. The method according to claim 1, further comprising:
    forming a dielectric layer between the CG and FG; and
    forming an etching mask over the control gate prior to forming the implant mask.

3. The method according to claim 1, wherein the vertical oxide comprises an inter-poly oxide.

4. The method according to claim 1, comprising:
    implanting lightly doped drain (LDD) and n-type dopants in the S/D regions.

5. The method according to claim 1, wherein the memory cells comprise split-gate non-volatile memory (NVM) cells.

6. The method according to claim 1, further comprising:
    forming an interpoly dielectric (IPD) between the CG and FG.

7. The method according to claim 1, further comprising:
    forming an oxide between the FG and the substrate.

8. The method according to claim 1, further comprising:
    forming an oxide between the SG and the substrate.

9. A method comprising:
    forming memory cells over a substrate, each memory cell includes a control gate (CG) formed over a floating gate (FG) and a select gate (SG) formed adjacent to a first side of the CG and FG, wherein a vertical inter-poly oxide (IPO) layer is formed between the SG and the CG and FG,
    forming a dielectric layer between the CG and FG;
    forming an etching mask over the control gate;
    forming and patterning an implant mask layer over a portion of the SG, CG and vertical oxide of each memory cell;
    implanting dopants into the substrate using the implant mask to form source drain (S/D) regions between the memory cells.

10. The method according to claim 9, comprising:
    implanting lightly doped drain (LDD) and n-type dopants in the S/D regions.

11. The method according to claim 9, wherein the memory cells comprise split-gate non-volatile memory (NVM) cells.

12. The method according to claim 9, further comprising:
    forming an interpoly dielectric (IPD) between the CG and FG.

13. The method according to claim 9, further comprising:
    forming an oxide between the FG and the substrate.

14. The method according to claim 9, further comprising:
    forming an oxide between the SG and the substrate.

15. A method comprising:
    forming a first polysilicon gate layer over a substrate;
    etching the first polysilicon gate layer to form a floating gate (FG) over the substrate;
    consecutively forming a dielectric layer, an second polysilicon gate layer and hard mask (HM) and patterning to form a control gate (CG) over the FG with the dielectric formed between the FG and CG and the HIM formed over the CG;
    forming an inter polysilicon oxide (IPO) on sides of the FG and CG;
    forming a third polysilicon gate layer and etching to form a SG on a first side of the FG and CG;
    forming an implant mask over a portion of the SG, CG and IPO; and
    implanting dopants into the substrate using the implant mask to form a source drain (S/D) region.

16. The method according to claim 15, comprising:
    implanting lightly doped drain (LDD) and n-type dopants in the S/D region.

17. The method according to claim 15, wherein the memory cells comprise split-gate non-volatile memory (NVM) cells.

18. The method according to claim 15, further comprising:
    forming a tunnel oxide layer over the substrate prior to forming the first polysilicon gate layer.

19. The method according to claim 15, wherein the dielectric layer comprises an inter polysilicon dielectric (IPD).

20. The method according to claim 15, further comprising:
    forming sidewall spacers over the S/D region.

* * * * *